United States Patent
Liu

(10) Patent No.: US 12,193,233 B2
(45) Date of Patent: Jan. 7, 2025

(54) THREE-DIMENSIONAL MEMORY DEVICE WITH RESTRAINED CHARGE MIGRATION AND METHOD FOR FORMING THE SAME

(71) Applicant: YANGTZE MEMORY TECHNOLOGIES CO., LTD., Wuhan (CN)

(72) Inventor: Xiaoxin Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 571 days.

(21) Appl. No.: 17/488,915

(22) Filed: Sep. 29, 2021

(65) Prior Publication Data

US 2022/0123017 A1   Apr. 21, 2022

Related U.S. Application Data

(63) Continuation of application No. PCT/CN2021/115807, filed on Aug. 31, 2021.

(30) Foreign Application Priority Data

Oct. 19, 2020 (CN) ............ 202011120882.7
Jun. 7, 2021 (CN) ............ 202110628570.5

(51) Int. Cl.
H10B 43/27 (2023.01)
H01L 21/28 (2006.01)
H01L 29/423 (2006.01)

(52) U.S. Cl.
CPC ........ *H10B 43/27* (2023.02); *H01L 29/40117* (2019.08); *H01L 29/4234* (2013.01)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS

2009/0242966 A1*  10/2009  Son ............... H01L 29/4234
                                           257/324
2010/0163968 A1*  7/2010  Kim ............... H10B 43/27
                                           257/E21.423
(Continued)

FOREIGN PATENT DOCUMENTS

CN   107768378 A   3/2018
CN   109417076 A   3/2019
(Continued)

OTHER PUBLICATIONS

International Search Report issued in corresponding International Application No. PCT/CN2021/115807, mailed Oct. 27, 2021, 4 pages.

(Continued)

*Primary Examiner* — Didarul A Mazumder
*Assistant Examiner* — Gustavo G Ramallo
(74) *Attorney, Agent, or Firm* — BAYES PLLC

(57) ABSTRACT

A three-dimensional (3D) memory device includes a first stack structure, a first channel structure, a second stack structure, and a second channel structure. The first stack structure includes interleaved first conductive layers and first dielectric layers. The first channel structure extends through the first stack structure along a first direction. The first channel structure includes a first semiconductor channel, and a first memory film over the first semiconductor channel. The first memory film includes a storage layer. The storage layer is separated by the first dielectric layers into a plurality of sections.

20 Claims, 18 Drawing Sheets

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50

See application file for complete search history.

(56) References Cited

U.S. PATENT DOCUMENTS

| | | |
|---|---|---|
| 2011/0147823 A1 | 6/2011 | Kuk et al. |
| 2012/0184078 A1 | 7/2012 | Kiyotoshi |
| 2016/0043093 A1 | 2/2016 | Lee et al. |
| 2016/0071861 A1* | 3/2016 | Serov ................. G11C 16/0408 438/257 |
| 2018/0019255 A1* | 1/2018 | Hopkins ................ H10B 43/10 |
| 2018/0040626 A1* | 2/2018 | Zhu ................... H01L 21/31111 |
| 2019/0067324 A1* | 2/2019 | Zhang .................... H01L 21/77 |
| 2019/0148405 A1 | 5/2019 | Shin |

FOREIGN PATENT DOCUMENTS

| | | |
|---|---|---|
| CN | 109817634 A | 5/2019 |
| CN | 112259549 A | 1/2021 |

OTHER PUBLICATIONS

International Search Report issued in corresponding International Application No. PCT/CN2021/115782, mailed Nov. 25, 2021, 4 pages.

* cited by examiner

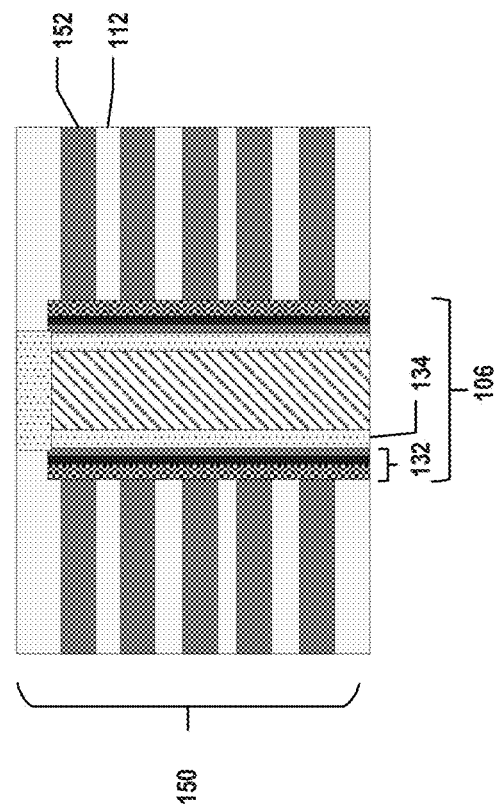
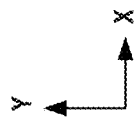

THREE-DIMENSIONAL MEMORY DEVICE WITH RESTRAINED CHARGE MIGRATION AND METHOD FOR FORMING THE SAME

CROSS-REFERENCE TO RELATED APPLICATIONS

This application is a continuation of International Application No. PCT/CN2021/115782, filed on Aug. 31, 2021, entitled "THREE-DIMENSIONAL MEMORY DEVICE AND METHOD FOR FORMING THE SAME," which claims the benefit of priorities to Chinese Patent Application No. 202110628570.5 filed on Jun. 7, 2021, and Chinese Patent Application No. 202011120882.7 filed on Oct. 19, 2020, all of which are incorporated herein by reference in their entireties. This application is also related to U.S. application Ser. No. 17/488,879, filed on Sep. 29, 2021, entitled "THREE-DIMENSIONAL MEMORY DEVICE AND METHOD FOR FORMING THE SAME," which is hereby incorporated by reference in its entirety.

BACKGROUND

The present disclosure relates to memory devices and methods for forming memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) semiconductor device architecture can address the density limitation in some planar semiconductor devices, for example, Flash memory devices.

SUMMARY

In one aspect, a 3D memory device is disclosed. The 3D memory device includes a first stack structure, a first channel structure, a second stack structure, and a second channel structure. The first stack structure includes interleaved first conductive layers and first dielectric layers. The first channel structure extends through the first stack structure along a first direction. The first channel structure includes a first semiconductor channel, and a first memory film over the first semiconductor channel. The first memory film includes a first storage layer. The second stack structure includes interleaved second conductive layers and second dielectric layers formed over the first stack structure. The second channel structure extends through the second stack structure along the first direction. The second channel structure includes a second semiconductor channel, and a second memory film over the second semiconductor channel. The first storage layer is separated by the first dielectric layers into a plurality of sections.

In another aspect, a 3D memory device is disclosed. The 3D memory device includes a plurality of memory structures stacking on each other. Each memory structure includes a stack structure, and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a first storage layer over the tunneling layer, and a blocking layer over the first storage layer. The first storage layer is separated by the dielectric layers into a plurality of sections.

In still another aspect, a system is disclosed. The system includes a 3D memory device configured to store data, and a memory controller. The 3D memory device includes a first stack structure, a first channel structure, a second stack structure, and a second channel structure. The first stack structure includes interleaved first conductive layers and first dielectric layers. The first channel structure extends through the first stack structure along a first direction. The first channel structure includes a first semiconductor channel, and a first memory film over the first semiconductor channel. The first memory film includes a first storage layer. The second stack structure includes interleaved second conductive layers and second dielectric layers formed over the first stack structure. The second channel structure extends through the second stack structure along the first direction. The second channel structure includes a second semiconductor channel, and a second memory film over the second semiconductor channel. The first storage layer is separated by the first dielectric layers into a plurality of sections. The memory controller is coupled to the 3D memory device and is configured to control operations of the 3D memory device.

In yet another aspect, a method for forming a 3D memory device is disclosed. A first dielectric stack structure including a plurality of first dielectric layers and a plurality of second dielectric layers alternatingly arranged is formed. A first channel structure is formed in the first dielectric stack structure along a first direction. A channel hole is formed in the first dielectric stack structure along the first direction. The sidewalls of the channel hole include a recess in the plurality of first dielectric layers. A first storage layer is formed in the recess of the channel hole in the plurality of first dielectric layers. A semiconductor channel is formed over the storage layer. A dielectric core is formed filling the channel hole. A second dielectric stack structure is formed over the first dielectric stack structure. The second dielectric stack structure includes a plurality of third dielectric layers and a plurality of fourth dielectric layers alternatingly arranged. A second channel structure is formed in the second dielectric stack structure along the first direction.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIGS. 8-16 illustrate cross-sections of an exemplary 3D memory device at different stages of a manufacturing process, according to some aspects of the present disclosure.

Figure 1:
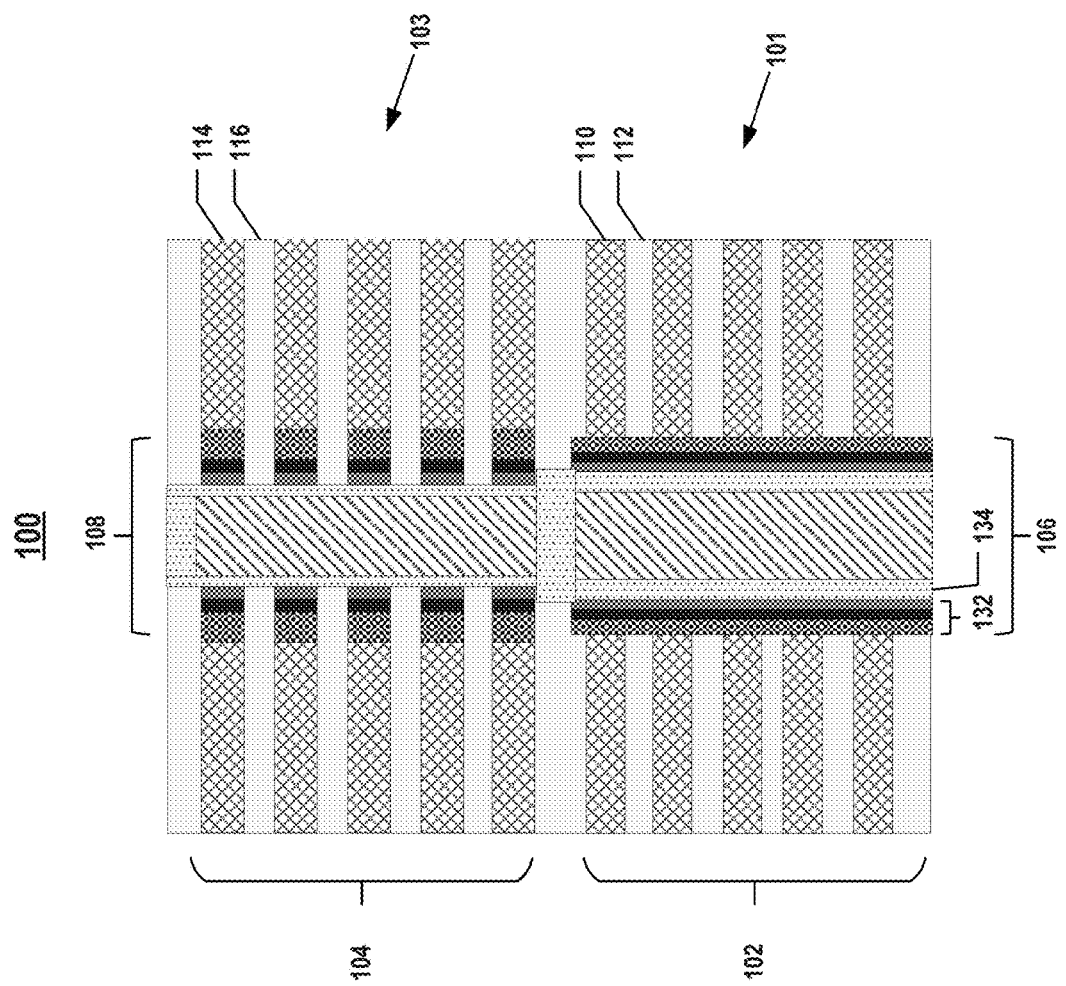
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

A 3D semiconductor device can be formed by stacking semiconductor wafers or dies and interconnecting them vertically so that the resulting structure acts as a single device to achieve performance improvements at reduced power and a smaller footprint than conventional planar processes. However, the charge lateral migration issue becomes a major issue of the 3D semiconductor device. In some 3D memory devices, such as 3D NAND memory devices, a stack of devices includes memory array devices and peripheral devices. As the shrinkage of the device size and thickness, the distance between the word lines becomes smaller and smaller. Hence, the charge lateral migration issue in the channel structure is one of the bottlenecks of the 3D NAND memory devices.

FIG. 1 illustrates a cross-section of an exemplary 3D memory device 100, according to some aspects of the present disclosure. 3D memory device 100 includes a memory structure 101, and a memory structure 103 stacking on memory structure 101. Memory structure 101 includes a first stack structure 102, and a first channel structure 106. Memory structure 103 includes a second stack structure 104, and a second channel structure 108.

As referred to herein, memory film 110 is a multilayer structure and is an element to achieve the storage function in the 3D memory devices. For example, memory film 110 may include a composite layer of silicon oxide/silicon oxynitride/silicon oxide (ONO). The ONO structure may be formed on the surface of the vertical channel and the ONO structure (memory film 110) is also located between the vertical channel and the conductive films, such as word lines. The word lines may serve as a control gate and is electrically or electronically coupled to memory film 110 in response to a bias.

First stack structure 102 includes interleaved first conductive layers 110 and first dielectric layers 112, and the stacked conductive/dielectric layer pairs are also referred to as a memory stack. In some implementations, first dielectric layers 112 may include dielectric materials including, but not limited to, silicon oxide, silicon nitride, silicon oxynitride, or any combination thereof. In some implementations, first conductive layers 110 may form the word lines and may include conductive materials including, but not limited to, tungsten (W), cobalt (Co), copper (Cu), aluminum (Al), polysilicon, doped silicon, silicides, or any combination thereof. First channel structure 106 extends through first stack structure 102 along the y-direction. First channel structure 106 may include a first semiconductor channel 134, and a first memory film 132 formed over first semiconductor channel 134. The meaning of "over" here, besides the explanation stated above, should be also interpreted "over" something from the top side or from the lateral side.

Figure 2:
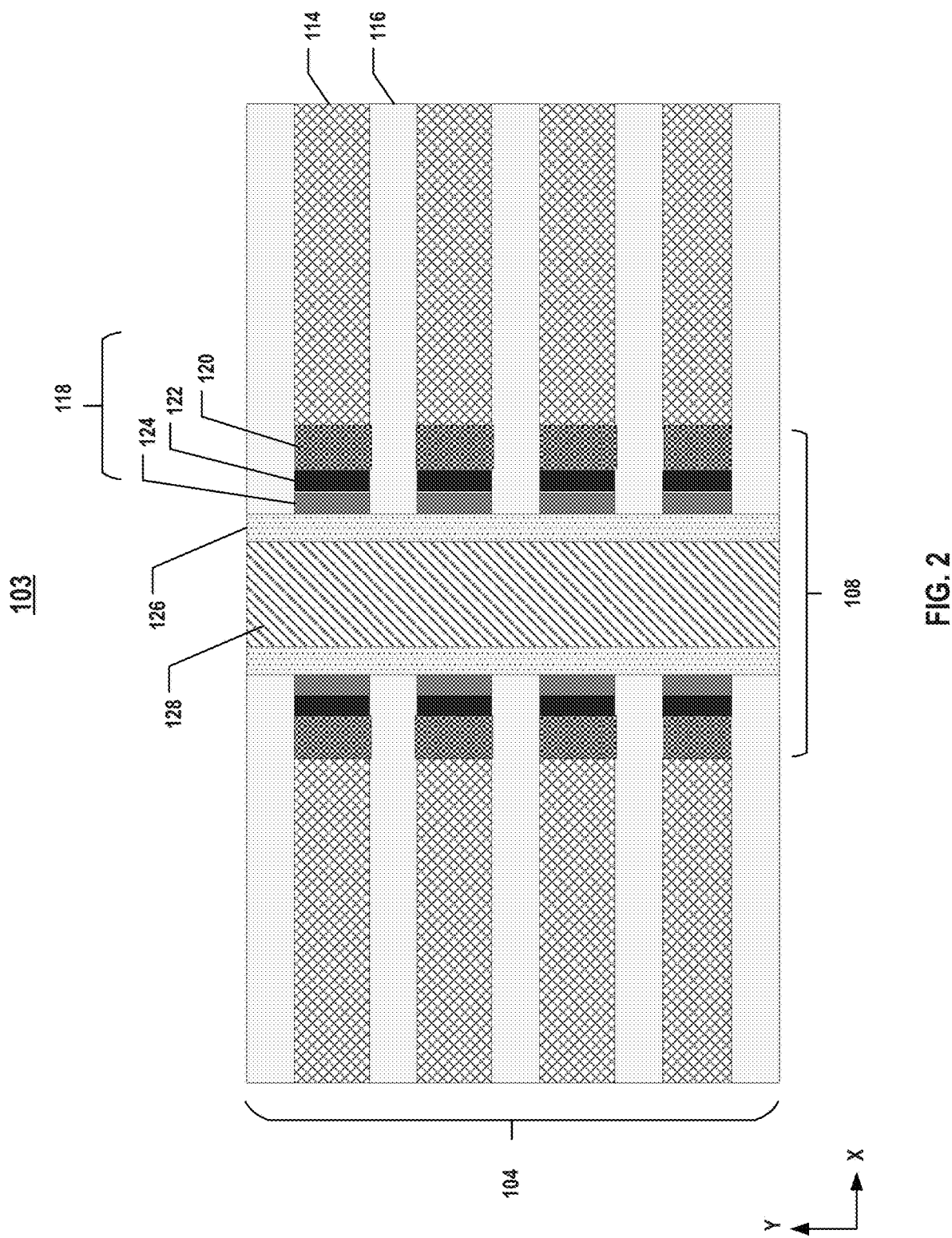
FIG. 2 illustrates a cross-section of an exemplary stack structure, according to some aspects of the present disclosure.

FIG. 2 illustrates a cross-section of an exemplary memory structure 103, according to some aspects of the present disclosure. As shown in FIG. 2, second stack structure 104 includes interleaved second conductive layers 114 and second dielectric layers 116 formed over first stack structure 102, and the stacked conductive/dielectric layer pairs are also referred to as a memory stack. In some implementations, second dielectric layers 116 may include dielectric materials including, but not limited to, silicon oxide, silicon nitride, silicon oxynitride, or any combination thereof. In some implementations, second conductive layers 114 may form the word lines and may include conductive materials including, but not limited to, W, Co, Cu, Al, polysilicon, doped silicon, silicides, or any combination thereof.

Second channel structure 108 extends through second stack structure 104 along the y-direction, and second channel structure 108 includes a second semiconductor channel 126, and a second memory film 118 over second semiconductor channel 126. In some implementations, second channel structure 108 may also include a dielectric core 128 in the center of second channel structure 108. In some implementations, second memory film 118 includes a tunneling layer 124 over second semiconductor channel 126, a storage layer 122 over tunneling layer 124, and a blocking layer 120 over storage layer 122.

In some implementations, tunneling layer 124 may include silicon oxide, silicon oxynitride, or any combination thereof. In some implementations, storage layer 122 may include silicon nitride, silicon oxynitride, silicon, or any combination thereof. In some implementations, blocking layer 120 may include silicon oxide, silicon oxynitride, high dielectric constant (high-k) dielectrics, or any combination thereof.

In some implementations, each word line, e.g., second conductive layers 114, in the memory stack, e.g., second stack structure 104, functions as a gate conductor of memory cells in NAND memory string, e.g., channel structure 108. In some embodiments, each word line (second conductive layer 114) may include the gate conductor made from tungsten, an adhesion layer including titanium/titanium nitride (Ti/TiN) or tantalum/tantalum nitride (Ta/TaN), and a gate dielectric layer made from high-k dielectric materials. The word lines may extend laterally coupling a plurality of memory cells.

As shown in FIG. 2, blocking layer 120, storage layer 122, and tunneling layer 124 of memory film 118 are divided by second dielectric layers 116 into a plurality of sections. In other words, memory film 118 or partial of memory film 118 in second stack structure 104 is an inconsecutive structure, and storage layer 122 is fully separated by second dielectric layers 116 into several isolated sections. In addition, second semiconductor channel 126 of second stack structure 104 is in contact with second dielectric layers 116. In some implementations, second semiconductor channel 126 of second stack structure 104 is in contact with tunneling layer 124 and second dielectric layers 116. In some implementations, tunneling layer 124 is in contact with storage layer 122, second semiconductor channel 126, and second dielectric layers 116. In some implementations, storage layer 122 may include a plurality of trap layers.

In some implementations, storage layer 122 may include a first trap layer and a second trap layer arranged along the x-direction. In some implementations, the first trap layer is in direct contact with blocking layer 120 and is an inconsecutive structure separated by second dielectric layers 116. In some implementations, the second trap layer is in direct contact with the first trap layer and may protect the first trap layer in later processes. In some implementations, the second trap layer is an inconsecutive structure separated by second dielectric layers 116. In some implementations, the second trap layer is a consecutive structure and may be partially separated by second dielectric layers 116. In some implementations, tunneling layer 124 may be formed over the second trap layer. In some implementations, the second trap layer may function as a tunneling layer, and the formation of tunneling layer 124 may be omitted.

As shown in FIG. 1, first memory film 132 is a consecutive structure extending along the y-direction, but second memory film 118 is inconsecutive film divided into several isolated sections. In some implementations, first semiconductor channel 134 is in contact with second semiconductor channel 126. In some implementations, first semiconductor channel 134 is in electric contact with second semiconductor channel 126. In some implementations, first memory film 132 and second memory film 118 are electrically isolated. For example, first memory film 132 and second memory film 118 may be separated by a dielectric material. In some implementations, first stack structure 102 and second stack structure 104 may be disposed on a substrate. In some implementations, a selective epitaxial growth (SEG) structure may be formed under first channel structure 106.

By dividing blocking layer 120, storage layer 122, and tunneling layer 124 into a plurality of isolated sections along the y-direction, partials of second memory film 118 are divided into several inconsecutive sections. The charge stored in storage layer 122 is isolated from other storage layers 122 corresponding to different word lines. In other words, the charge stored in storage layer 122 corresponding to different word lines is isolated from each other. Hence, the charge migration may be restrained in 3D memory device 100.

Figure 3:
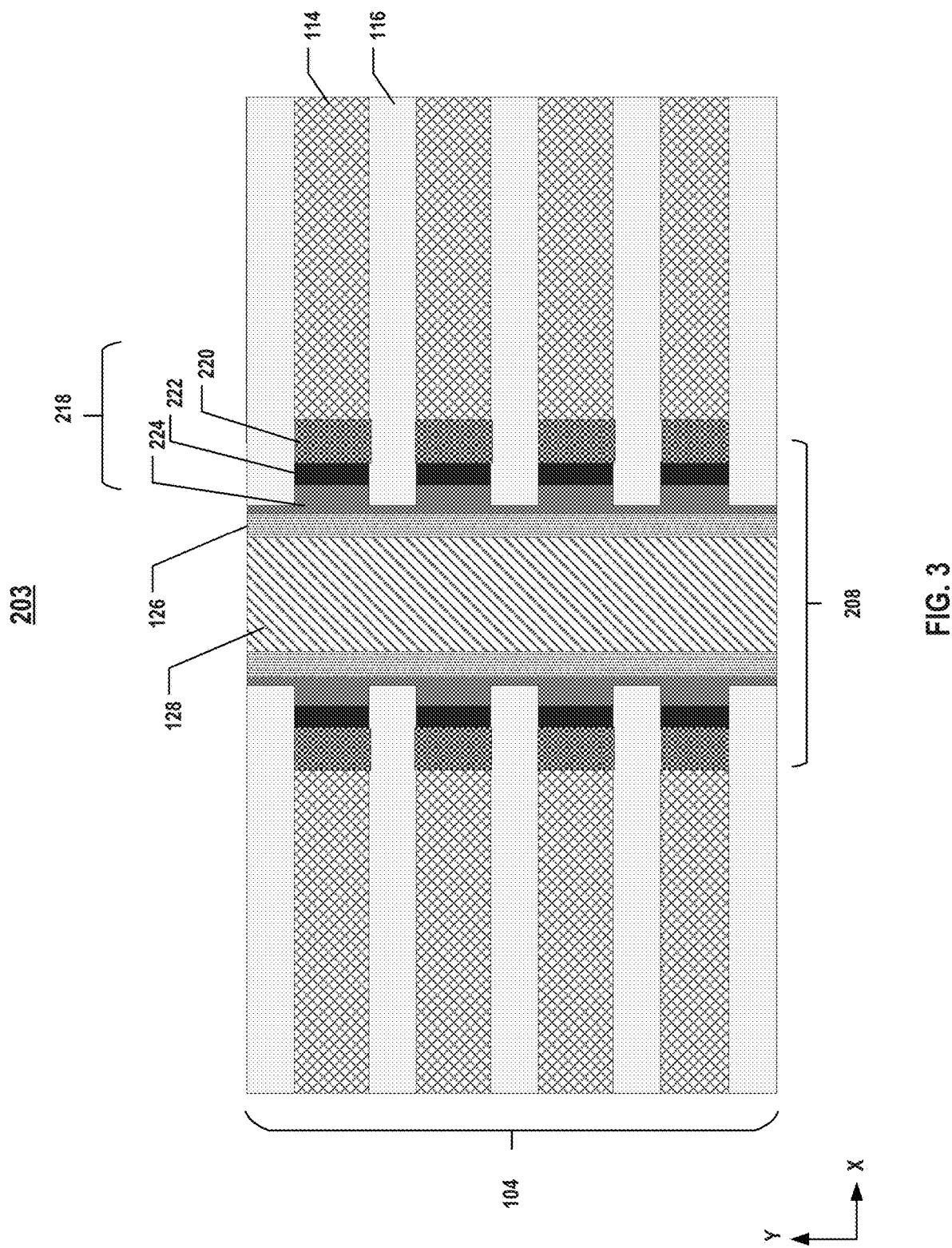
FIG. 3 illustrates a cross-section of another exemplary stack structure, according to some aspects of the present disclosure.

FIG. 3 illustrates a cross-section of another exemplary memory structure 203, according to some aspects of the present disclosure. Memory structure 203 may include second stack structure 104 and a channel structure 208. In some implementations, second stack structure 104 of memory structure 203 may be similar to second stack structure 104 of memory structure 103. Channel structure 208 extends through second stack structure 104 along the y-direction. Channel structure 208 may include semiconductor channel 126, and a memory film 218 formed over semiconductor channel 126. In some implementations, channel structure 208 may also include dielectric core 128 in the center of channel structure 208. In some implementations, semiconductor channel 126 and dielectric core 128 of memory structure 203 may be similar to semiconductor channel 126 and dielectric core 128 of memory structure 103.

In some implementations, memory film 218 may include a tunneling layer 224 over semiconductor channel 126, a storage layer 222 over tunneling layer 224, and a blocking layer 220 over storage layer 222. In some implementations, tunneling layer 224 may include silicon oxide, silicon oxynitride, or any combination thereof. In some implementations, storage layer 222 may include silicon nitride, silicon oxynitride, silicon, or any combination thereof. In some implementations, blocking layer 220 may include silicon oxide, silicon oxynitride, high dielectric constant (high-k) dielectrics, or any combination thereof.

As shown in FIG. 3, tunneling layer 224 may include a first portion disposed between two adjacent second dielectric layers 116 and in contact with storage layer 222. Tunneling layer 224 may further include a second portion physically extended along y-direction across several second dielectric layers 116. The first portion and the second portion of tunneling layer 224 are in direct contact with each other. In other words, the first portion and the second portion of tunneling layer 224 are physically connected. In some implementations, the first portion and the second portion of tunneling layer 224 may be formed in the same deposition operation. In some implementations, the first portion and the second portion of tunneling layer 224 may be formed in different deposition operations. In other words, tunneling layer 224 is not fully inconsecutive along the y-direction, and only blocking layer 220 and storage layer 222 are fully divided by second dielectric layers 116 into a plurality of isolated sections. In some implementations, semiconductor channel 126 and second dielectric layers 116 are separated by the second portion of tunneling layer 224. In some implementations, tunneling layer 224 is in contact with second dielectric layers 116. In some implementations, storage layer 222 may include a plurality of trap layers. In some implementations, storage layer 222 may include a first trap layer and a second trap layer arranged along the x-direction. In some implementations, the first trap layer is in direct contact with blocking layer 220 and is an inconsecutive structure separated by second dielectric layers 116. In some implementations, the second trap layer is in direct contact with the first trap layer and may protect the first trap layer in later processes. In some implementations, the second trap layer is an inconsecutive structure separated by second dielectric layers 116. In some implementations, the second trap layer is a consecutive structure and may be partially separated by second dielectric layers 116. In some implementations, tunneling layer 224 may be formed over the second trap layer. In some implementations, the second trap layer may function as a tunneling layer, and the formation of tunneling layer 224 may be omitted.

By dividing blocking layer 220 and storage layer 222 into a plurality of isolated sections along the y-direction, partials of memory film 218 are separated into several inconsecutive sections. The charge stored in storage layer 222 is isolated from other storage layer 222 corresponding to different word lines. In other words, the charge stored in storage layer 222 corresponding to different word lines is isolated from each other. Hence, the charge migration may be restrained in memory structure 203.

Figure 4:
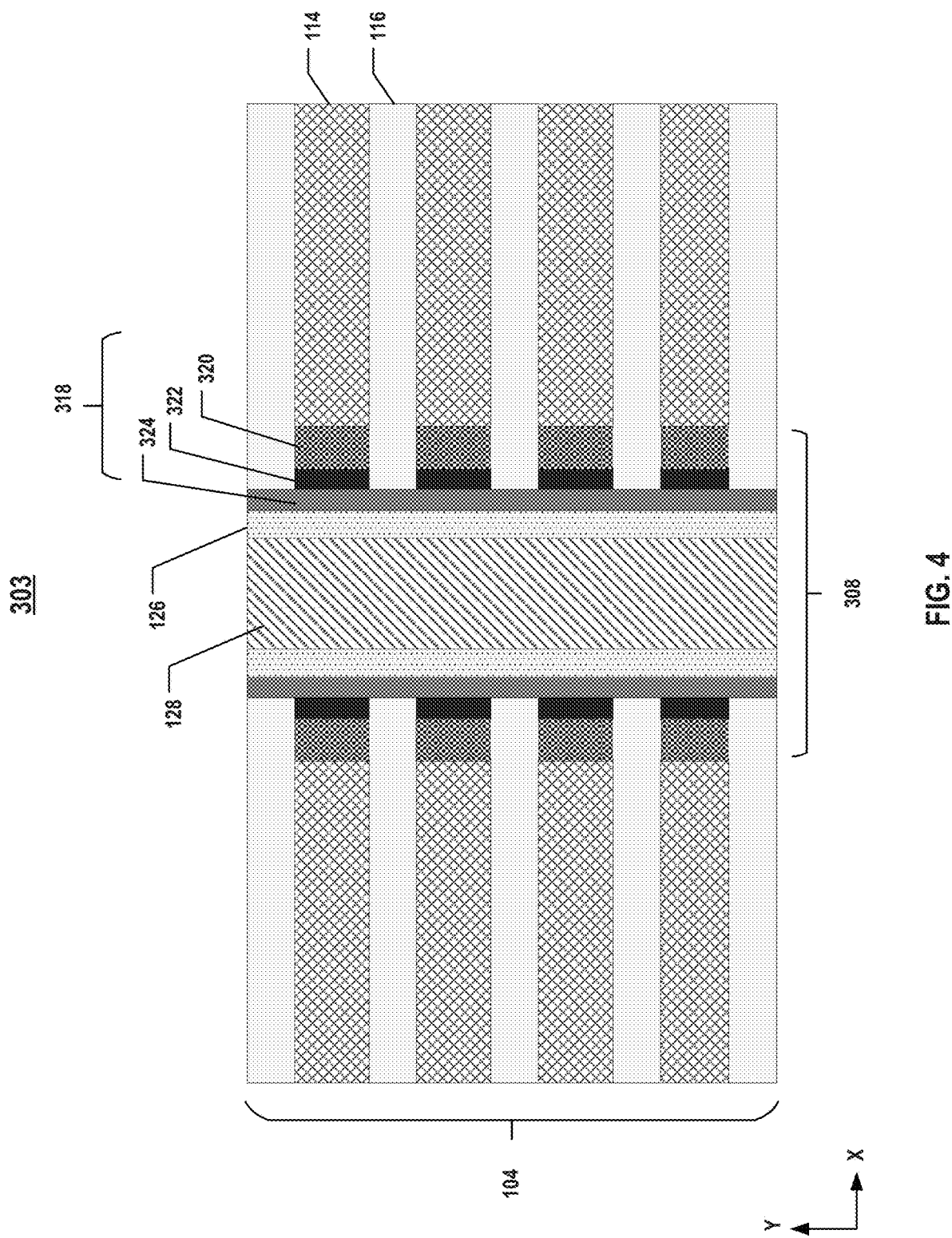
FIG. 4 illustrates a cross-section of still another exemplary stack structure, according to some aspects of the present disclosure.

FIG. 4 illustrates a cross-section of still another exemplary memory structure 303, according to some aspects of the present disclosure. Memory structure 303 includes second stack structure 104 and a channel structure 308. In some implementations, second stack structure 104 of memory structure 303 may be similar to second stack structure 104 of memory structure 103 or 203. Channel structure 308 extends through second stack structure 104 along the y-direction. Channel structure 308 may include semiconductor channel 126, and a memory film 318 formed over semiconductor channel 126. In some implementations, channel structure 308 may also include dielectric core 128 in the center of channel structure 308. In some implementations, semiconductor channel 126 and dielectric core 128 of memory structure 303 may be similar to semiconductor channel 126 and dielectric core 128 of memory structure 103 or 203.

In some implementations, memory film 318 may include a tunneling layer 324 over semiconductor channel 126, a storage layer 322 over tunneling layer 324, and a blocking layer 320 over storage layer 322. In some implementations, tunneling layer 324 may include silicon oxide, silicon oxynitride, or any combination thereof. In some implementations, storage layer 322 may include silicon nitride, silicon oxynitride, silicon, or any combination thereof. In some implementations, blocking layer 320 may include silicon oxide, silicon oxynitride, high dielectric constant (high-k) dielectrics, or any combination thereof.

As shown in FIG. 4, tunneling layer 324 may be disposed along y-direction parallel to semiconductor channel 126. In other words, in some implementations, only blocking layer 320 and storage layer 322 are fully divided by second dielectric layers 116 into a plurality of isolated sections. In some implementations, semiconductor channel 126 and second dielectric layers 116 are separated by tunneling layer 324. In some implementations, tunneling layer 324 is in contact with second dielectric layers 116. In some implementations, storage layer 322 may include a plurality of trap layers. In some implementations, storage layer 322 may include a first trap layer and a second trap layer arranged along the x-direction. In some implementations, the first trap layer is in direct contact with blocking layer 320 and is an inconsecutive structure separated by second dielectric layers 116. In some implementations, the second trap layer is in direct contact with the first trap layer and may protect the first trap layer in later processes. In some implementations, the second trap layer is an inconsecutive structure separated by second dielectric layers 116. In some implementations, the second trap layer is a consecutive structure and may be partially separated by second dielectric layers 116. In some implementations, tunneling layer 324 may be formed over the second trap layer. In some implementations, the second trap layer may function as a tunneling layer, and the formation of tunneling layer 324 may be omitted.

By dividing blocking layer 320 and storage layer 322 into a plurality of isolated sections along the y-direction, partials of memory film 318 are separated into several inconsecutive sections. The charge stored in storage layer 322 is isolated from other storage layer 322 corresponding to different word lines. In other words, the charge stored in storage layer 322 corresponding to different word lines is isolated from each other. Hence, the charge migration may be restrained in memory structure 303.

Figure 5:
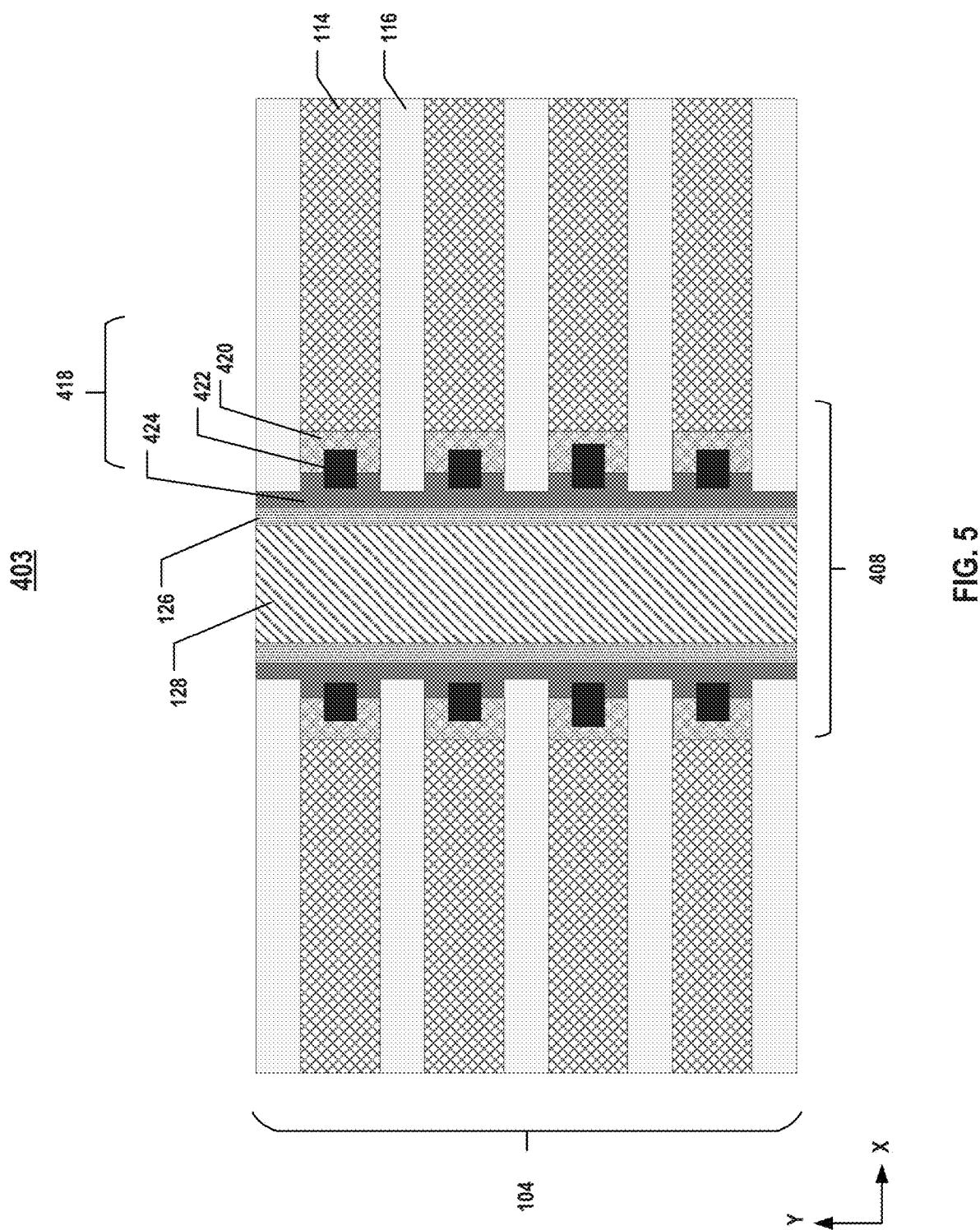
FIG. 5 illustrates a cross-section of yet another exemplary stack structure, according to some aspects of the present disclosure.

FIG. 5 illustrates a cross-section of yet another exemplary memory structure 403, according to some aspects of the present disclosure. Memory structure 403 may include second stack structure 104 and a channel structure 408.

In some implementations, second stack structure 104 of memory structure 403 may be similar to second stack structure 104 of memory structure 103, 203, or 303. Channel structure 408 extends through second stack structure 104 along the y-direction. Channel structure 408 may include semiconductor channel 126, and a memory film 418 formed over semiconductor channel 126. In some implementations, channel structure 408 may also include dielectric core 128 in the center of channel structure 408. In some implementations, semiconductor channel 126 and dielectric core 128 of memory structure 403 may be similar to semiconductor channel 126 and dielectric core 128 of memory structure 103, 203, or 303.

In some implementations, memory film 418 may include a tunneling layer 424 over semiconductor channel 126, a storage layer 422 over tunneling layer 424, and a blocking layer 420 over storage layer 422. In some implementations, tunneling layer 424 may include silicon oxide, silicon oxynitride, or any combination thereof. In some implementations, storage layer 422 may include silicon nitride, silicon oxynitride, silicon, or any combination thereof. In some implementations, blocking layer 420 may include silicon oxide, silicon oxynitride, high dielectric constant (high-k) dielectrics, or any combination thereof.

As shown in FIG. 5, storage layer 422 is surrounded by tunneling layer 424 and blocking layer 420. Tunneling layer 424 is in contact with semiconductor channel 126, second dielectric layers 116, blocking layer 420, and storage layer 422. In other words, storage layer 422 is fully surrounded by blocking layer 420 and tunneling layer 424, and blocking layer 420 and tunneling layer 424 are in contact with each other. In some implementations, storage layer 422 may include a plurality of trap layers. In some implementations, one of the plurality of trap layers may function as tunneling layer 424.

By dividing blocking layer 420 and storage layer 422 into a plurality of isolated sections along the y-direction, partials of memory film 418 are separated into several inconsecutive sections. The charge stored in storage layer 422 is isolated from other storage layer 422 corresponding to different word lines. In other words, the charge stored in storage layer 422 corresponding to different word lines is isolated from each other. Hence, the charge migration may be restrained in memory structure 403.

Figure 6:
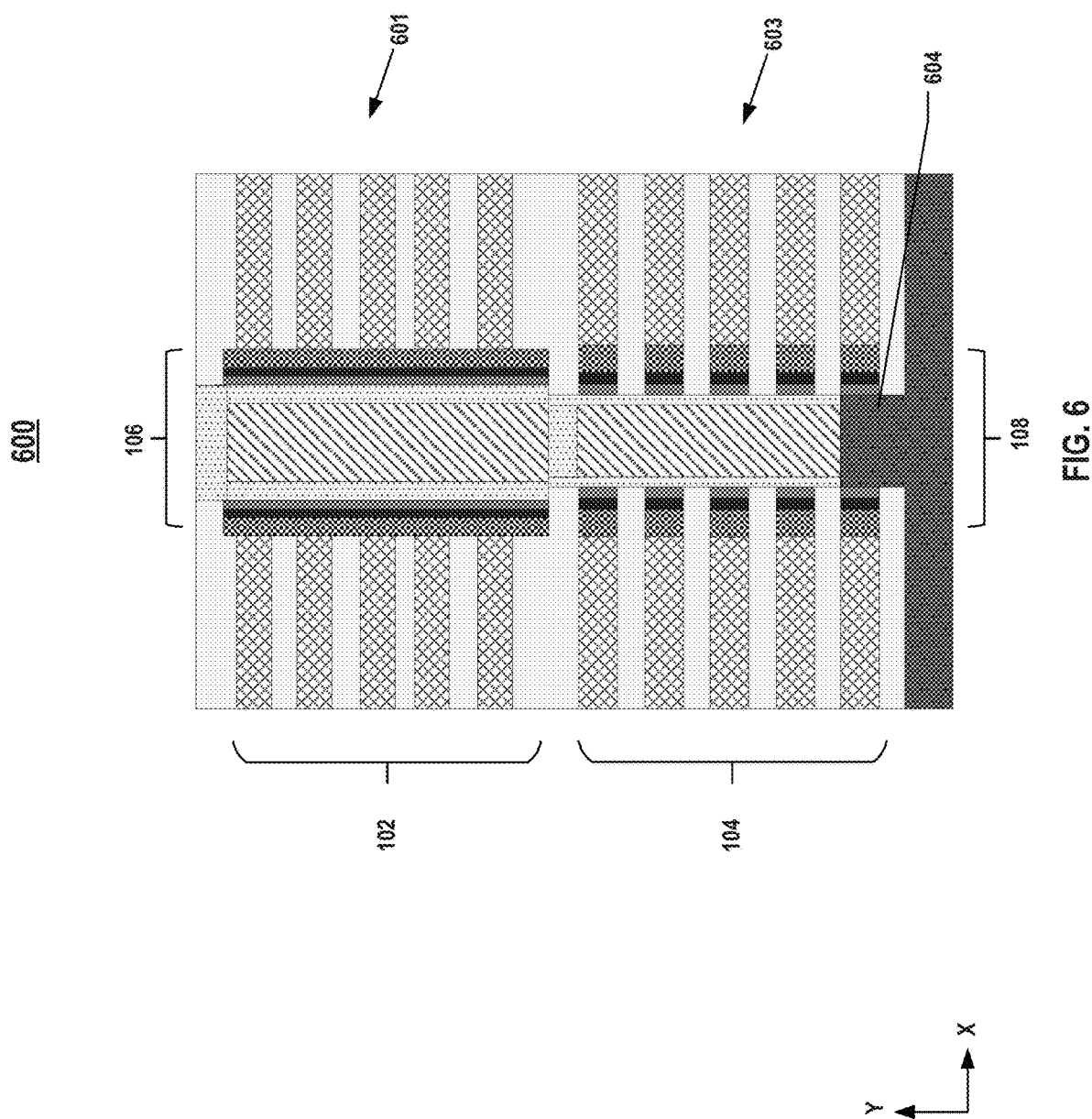
FIG. 6 illustrates a cross-section of another exemplary 3D memory device, according to some aspects of the present disclosure.

FIG. 6 illustrates a cross-section of another exemplary 3D memory device 600, according to some aspects of the present disclosure. 3D memory device 600 includes a memory structure 603, and a memory structure 601 stacking on memory structure 603. Memory structure 601 includes first stack structure 102, and first channel structure 106. Memory structure 603 includes second stack structure 104, and second channel structure 108. As shown in FIG. 6, the memory film of second channel structure 108 is inconsecutive film divided into several isolated sections, and the memory film of first channel structure 106 is a consecutive structure extending along the y-direction. In other words, memory structure 603 with inconsecutive memory film may be formed beneath memory structure 601 having a consecutive memory film.

In some implementations, as shown in FIG. 6, second channel structure 108 may further include a semiconductor plug 604 on the source end of second channel structure 108. Semiconductor plug 604 may be in contact with semiconductor channel 126 of second channel structure 108. Semiconductor plug 604, also known as selective epitaxial growth (SEG), can be selectively grown from a substrate and may have the same material as the substrate, such as single crystalline silicon. Second channel structure 108 in contact with semiconductor plug 604 on the source end of channel structure 108 is referred to herein as a "bottom plug channel structure."

In some implementations, different from bottom plug channel structure 604 in FIG. 6, second channel structure 108 may include a sidewall plug channel structure and is free of semiconductor plug 604 on the source end thereof. Instead, a sidewall semiconductor layer vertically between the substrate and second stack structure 104 can be in contact with the sidewall of the sidewall semiconductor layer of the channel structures. The sidewall semiconductor layer can include semiconductor materials, such as polysilicon.

In some implementations, the substrate (e.g., having single crystalline silicon) may be replaced with a semiconductor layer in contact with semiconductor channel 126 of a bottom open channel structure on the source end of second channel structure 108. Parts of memory film 118 of second channel structure 108 on the source end can be removed to expose semiconductor channel 126 to contact the semiconductor layer. In some implementations, part of semiconductor channel 126 on the source end of second channel structure 108 is doped to form a doped region that is in contact with the semiconductor layer. The semiconductor layer can include semiconductor materials, such as polysilicon.

As shown in FIG. 6, memory structure 603 having inconsecutive storage layer 122 is formed under memory structure 601. In some implementations, when the memory structure having inconsecutive storage layer is disposed at the bottom position, since the charge migration is restrained the hot carrier and the reliability of 3D memory device 600 can be therefore improved. In some implementations, when the memory structure having inconsecutive storage layer is disposed at the bottom position, the plasma leakage damage of the silicon oxynitride/silicon oxide (NO) layers can be restrained as well. It is understood that the memory structure having inconsecutive storage layer may be also disposed above the memory structure having consecutive storage layer according to different designs, and is not limited here.

Figure 7:
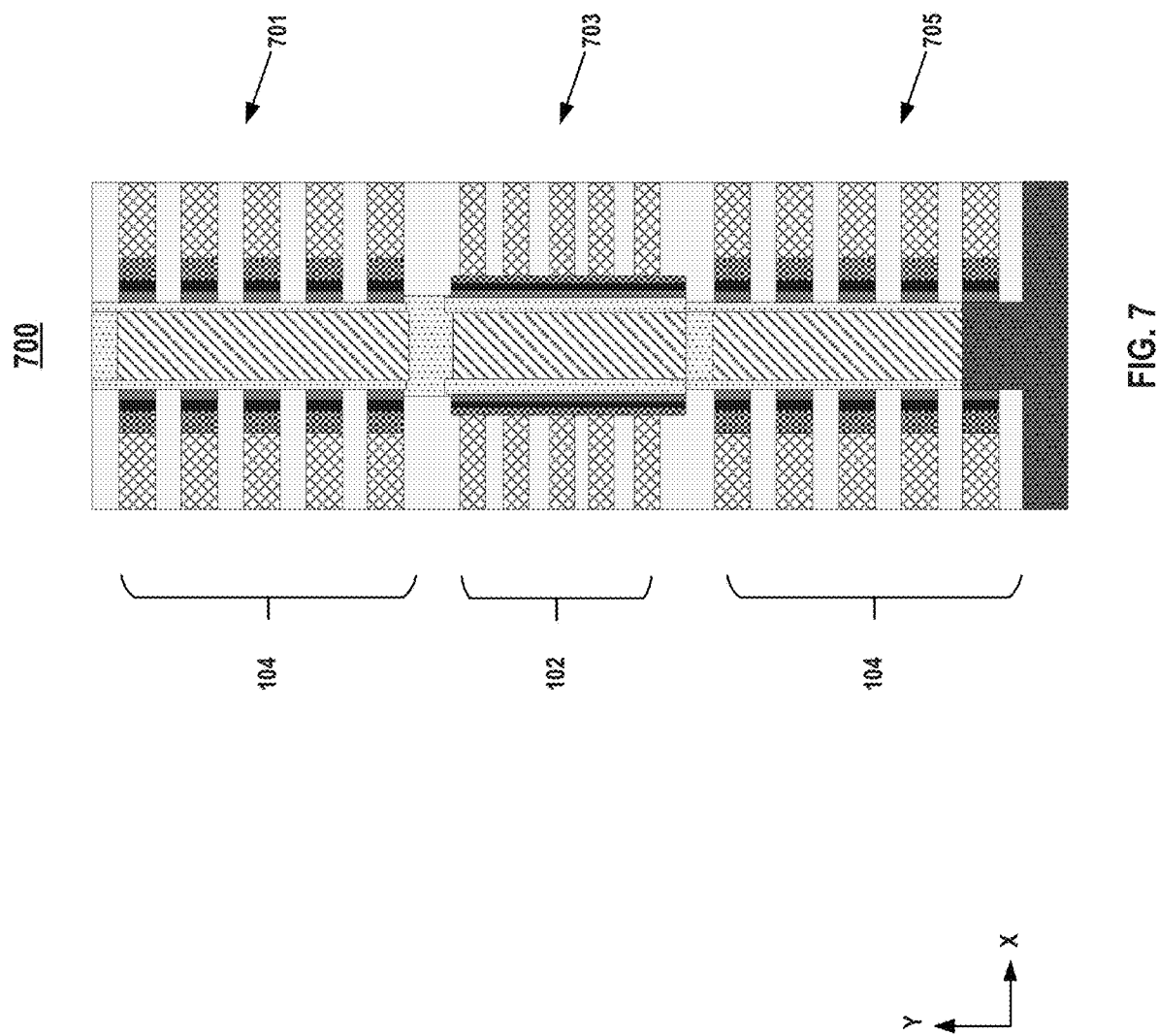
FIG. 7 illustrates a cross-section of still another exemplary 3D memory device, according to some aspects of the present disclosure.

FIG. 7 illustrates a cross-section of still another exemplary 3D memory device 700, according to some aspects of the present disclosure. 3D memory device 700 includes a memory structure 705, a memory structure 703 stacking on memory structure 705, and a memory structure 701 stacking on memory structure 703. As shown in FIG. 7, the storage layer of memory structure 701 and the storage layer of memory structure 705 are inconsecutive films separated into several isolated sections, and the storage layer of memory structure 703 is a consecutive structure extending along the y-direction. In other words, memory structure 703 with consecutive storage layer may be formed between two memory structures, memory structure 701 and memory structure 705, having inconsecutive storage layers.

In some implementations, semiconductor channels of the stacked memory structures, e.g., memory structure 701, memory structure 703, and/or memory structure 705, may be electrically connected. In some implementations, the semiconductor channels of the stacked memory structures, e.g., memory structure 701, memory structure 703, and/or memory structure 705, may be aligned with each other. The meaning of "aligned" here is the semiconductor channels of the stacked memory structures, e.g., memory structure 701, memory structure 703, and/or memory structure 705, are disposed along a same center axis of the channel structures. In some implementations, the memory films of the stacked memory structures, e.g., memory structure 701, memory structure 703, and/or memory structure 705, may not be aligned with each other.

It is understood that memory structure 701 and/or memory structure 705 having inconsecutive storage layer may be replaced by other structure, e.g., memory structure 203, memory structure 303, and/or memory structure 403 shown in FIGS. 3-5. It is also understood that, in some implementations, the memory structure with inconsecutive storage layer may be formed between two memory structures having consecutive storage layers. In some implementations, the 3D memory device may be formed by stacking a plurality of memory structures with inconsecutive storage layers.

FIGS. 8-16 illustrate cross-sections of 3D memory device 100 at different stages of a manufacturing process, according to some aspects of the present disclosure. FIG. 17 illustrates a flowchart of an exemplary method 800 for forming 3D memory device 100, according to some aspects of the present disclosure. For the purpose of better describing the present disclosure, the cross-sections of 3D memory device 100 in FIGS. 8-16 and method 800 in FIG. 17 will be discussed together. It is understood that the operations shown in method 800 are not exhaustive and that other operations may be performed as well before, after, or between any of the illustrated operations. Further, some of the operations may be performed simultaneously, or in a different order than shown in FIGS. 8-16 and FIG. 17.

As shown in FIG. 8 and operation 802 of FIG. 17, a first dielectric stack structure 150 is formed. First dielectric stack structure 150 may include a plurality of dielectric/sacrificial layer pairs. In some implementations, first dielectric stack structure 150 may be formed on a substrate (not shown). In some implementations, the substrate may be a doped semiconductor layer. The dielectric/sacrificial layer pairs may include interleaved dielectric layers 112 and sacrificial layers 152 extending along the x-direction. In some implementations, each dielectric layer 112 may include a layer of silicon oxide, and each sacrificial layer 152 may include a layer of silicon nitride. First dielectric stack structure 150 may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between the substrate and first dielectric stack structure 150 by depositing dielectric materials, such as silicon oxide, on the substrate.

As shown in FIG. 8 and operation 804 of FIG. 17, first channel structure 106 is formed in first dielectric stack structure 150 along the y-direction. First channel structure 106 may include first semiconductor channel 134, and first memory film 132 formed over first semiconductor channel 134. In some implementations, first memory film 132 is a consecutive memory film extending along the y-direction.

Figure 9:
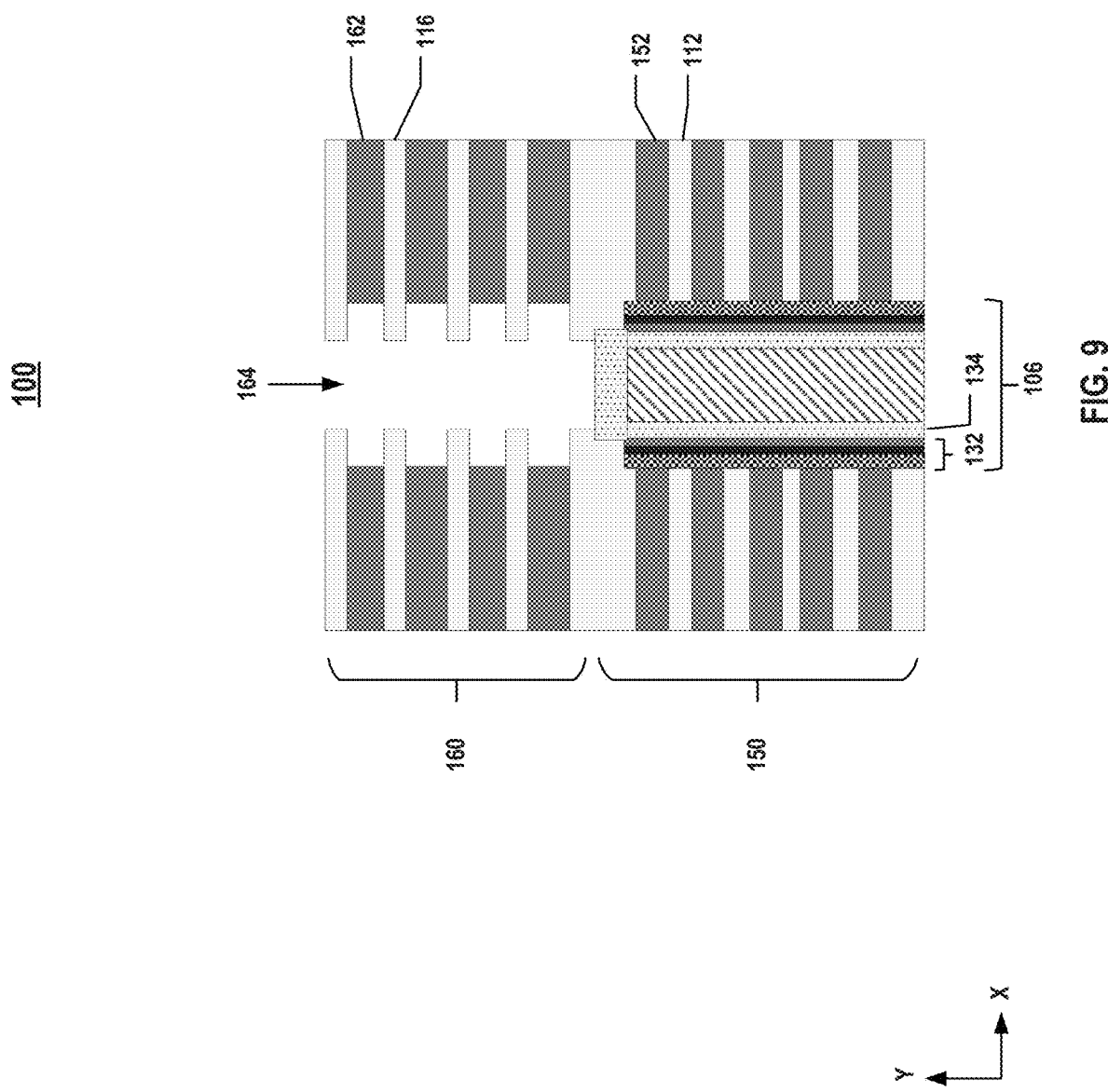

As shown in FIG. 9 and operation 806 of FIG. 17, a second dielectric stack structure 160 is formed over first dielectric stack structure 150. Second dielectric stack structure 160 may include a plurality of dielectric/sacrificial layer pairs. The dielectric/sacrificial layer pairs may include interleaved dielectric layers 116 and sacrificial layers 162 extending along the x-direction. In some implementations, the materials and fabrication processes of dielectric layers 116 and sacrificial layers 162 of second dielectric stack structure 160 may be similar to those of dielectric layers 112 and sacrificial layers 152 of first dielectric stack structure 150.

As shown in FIG. 9 and operation 808 of FIG. 17, a channel hole 164 is formed in second dielectric stack structure 160 along the y-direction. In some implementations, an etch process may be performed to form channel hole 164 in second dielectric stack structure 160 that extends vertically (y-direction) through the interleaved dielectric/sacrificial layers. In some implementations, fabrication processes for forming channel hole 164 may include wet etching and/or dry etching, such as deep reactive ion etching (DRIE). In some implementations, channel hole 164 may extend further into the top portion of first dielectric stack structure 150.

In some implementations, because dielectric layers 116 and sacrificial layers 162 may have different removal rates during the etching process, by choosing the etchant of the etching operation, the sidewalls of channel hole 164 may include a recess in each of sacrificial layers 162. For example, when dielectric layers 116 include silicon oxide and sacrificial layers 162 include silicon nitride, an etchant having a higher etching rate to silicon nitride may be used to form the recess. In some implementations, channel hole 164 may be first formed in second dielectric stack structure 160 along the y-direction by using an etch operation. Then, another etch operation may be performed to remove portions of sacrificial layers 162 to form the recess.

Figure 10:
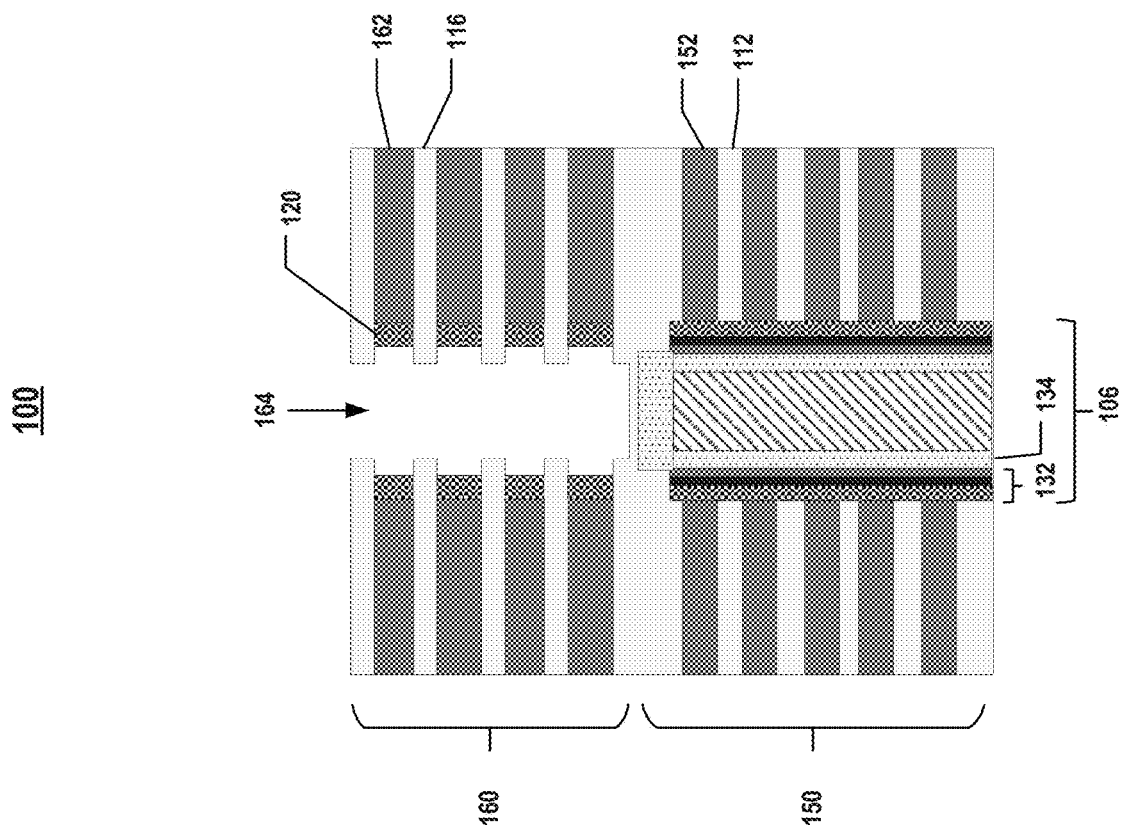

As shown in FIG. 10 and operation 810 of FIG. 17, blocking layer 120 is formed on the sidewalls of channel hole 164 on sacrificial layers 162. In some implementations, blocking layer 120 may include silicon oxide, silicon oxynitride, high dielectric constant (high-k) dielectrics, or any combination thereof. In some implementations, blocking layer 120 may be formed by a deposition operation. In some implementations, blocking layer 120 may be formed by an oxidation operation to oxidate a portion of sacrificial layers 162 into silicon oxide, silicon oxynitride, or other suitable materials. In some implementations, blocking layer 120 and dielectric layers 116 may be formed by the same material.

Figure 11:
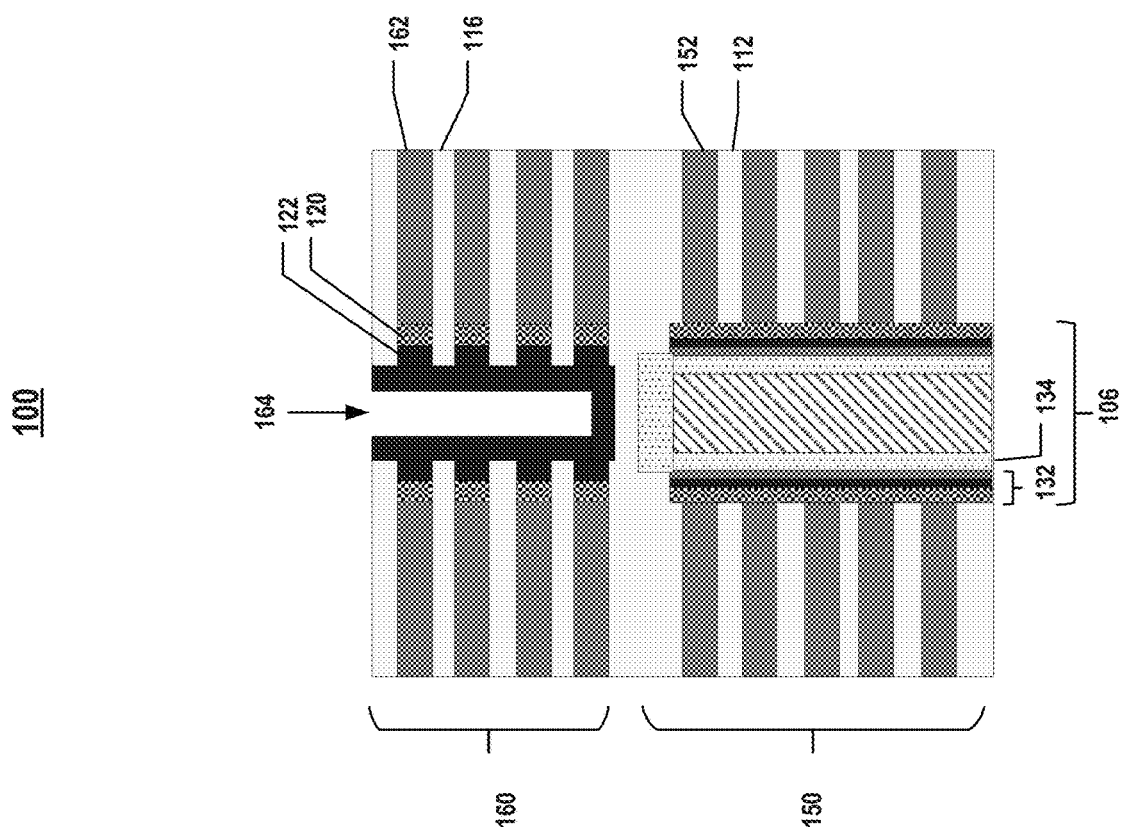
Figure 12:
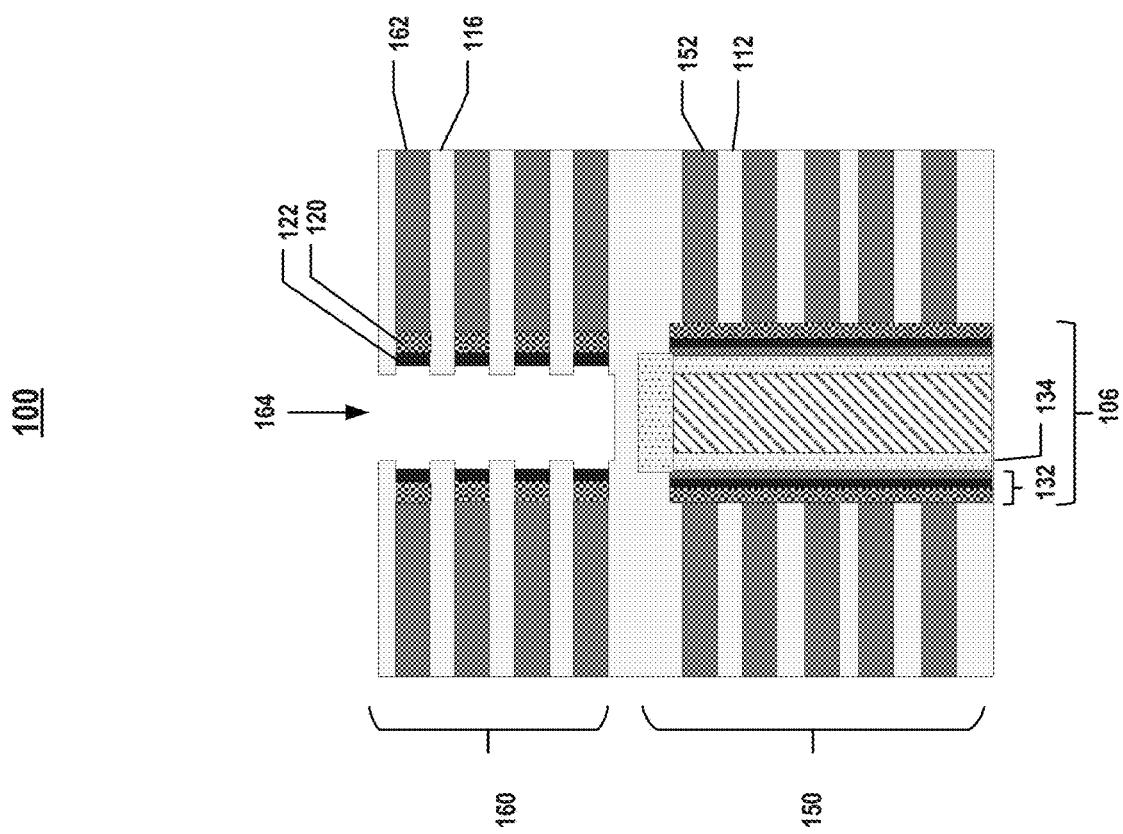

As shown in FIG. 11 and operation 812 of FIG. 17, storage layer 122 may be formed over blocking layer 120 on the sidewalls of channel hole 164 on sacrificial layers 162. In some implementations, storage layer 122 may first be formed on the sidewalls of channel hole 164 covering dielectric layers 116 and blocking layer 120, as shown in FIG. 11. Then, an etch operation may be performed to pull back a portion of storage layer 122, as shown in FIG. 12. In some implementations, the portion of storage layer 122 may be removed by dry etch, wet etch, or other suitable processes. After the pull-back process, storage layer 122 is divided by dielectric layers 116 into a plurality of isolated sections.

Figure 13:
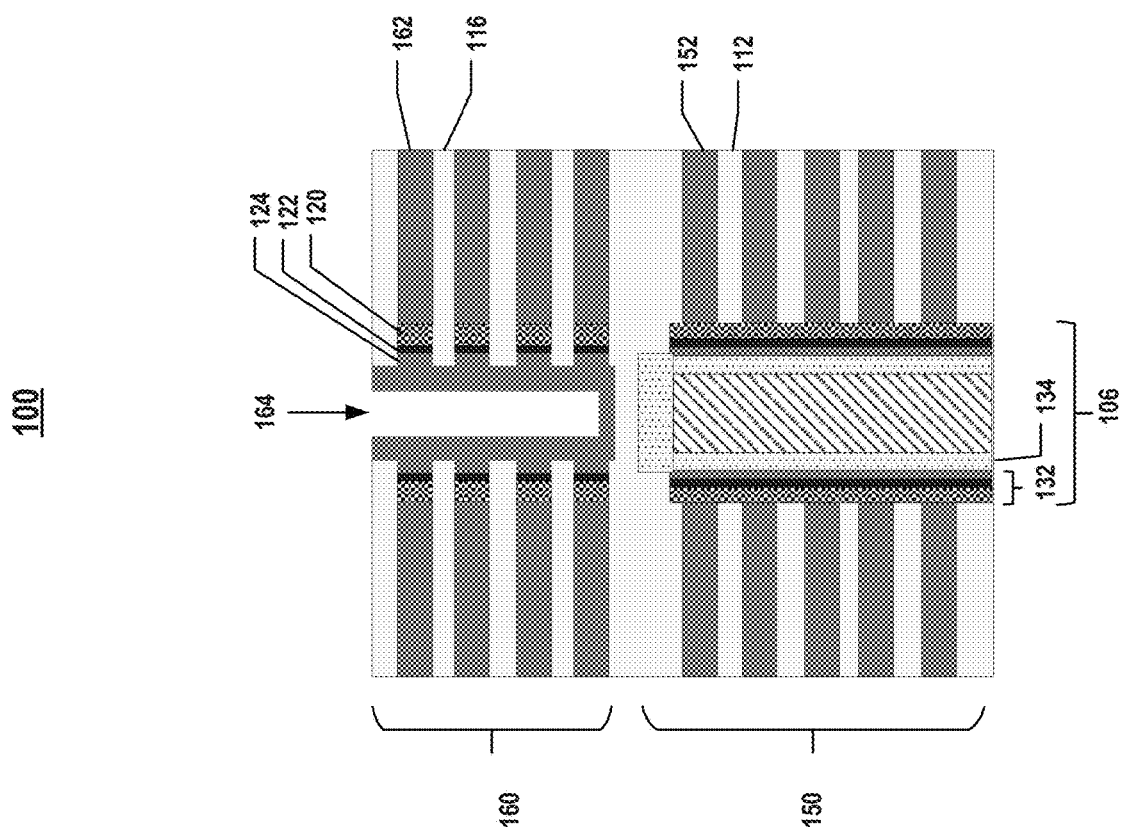
Figure 14:
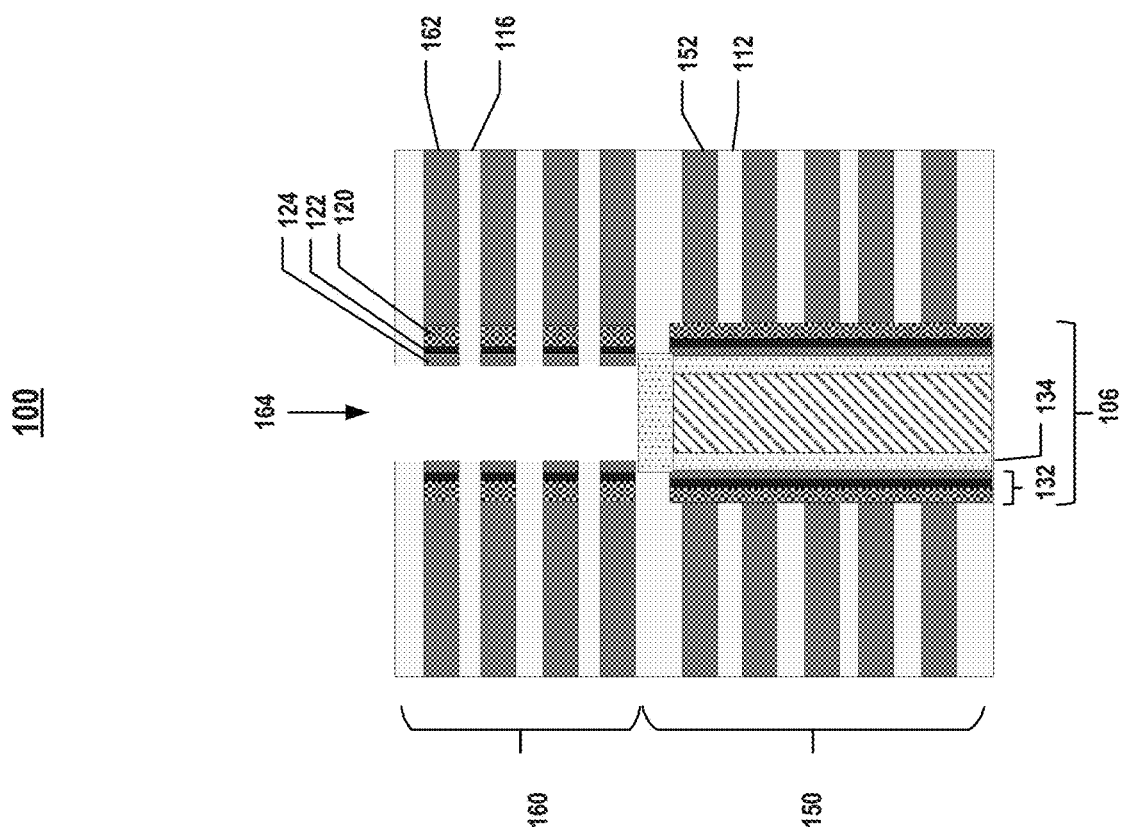

As shown in FIG. 13 and operation 814 of FIG. 17, tunneling layer 124 may be formed over storage layer 122 and dielectric layers 116 on the sidewalls of channel hole 164. In some implementations, tunneling layer 124 may further be thinned by performing an etch operation. In some implementations, tunneling layer 124 may further be thinned until tunneling layer 124 is fully isolated by dielectric layers 116, as shown in FIG. 14. In some implementations, tunneling layer 124 may not be fully isolated by dielectric layers 116 after the thinning operation and form a structure similar to tunneling layer 224 shown in FIG. 3. In some implementations, tunneling layer 124 may be disposed along y-direction and form a structure similar to tunneling layer 324 shown in FIG. 4.

Figure 15:
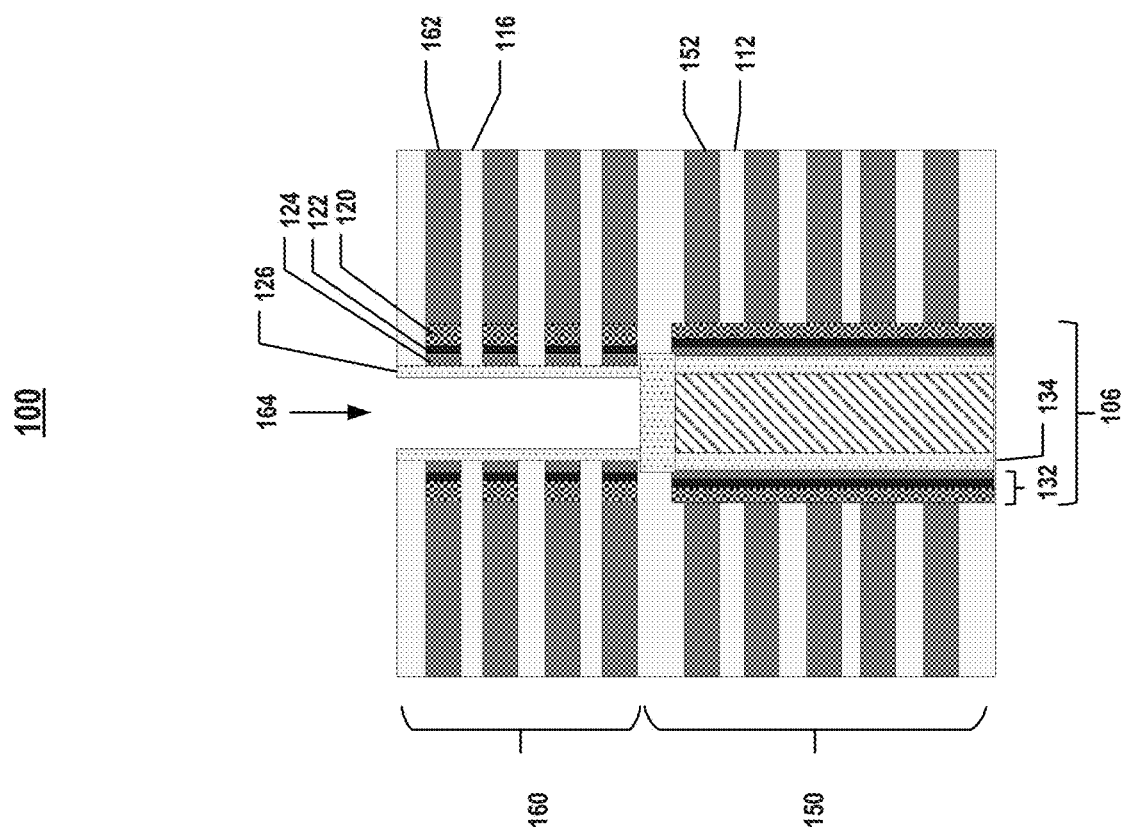

As shown in FIG. 15 and operation 816 of FIG. 17, semiconductor channel 126 may be formed over tunneling layer 124. In some implementations, semiconductor channel 126 may be in direct contact with dielectric layers 116. In some implementations, dielectric core 128 may be filled in channel hole 164.

Figure 16:
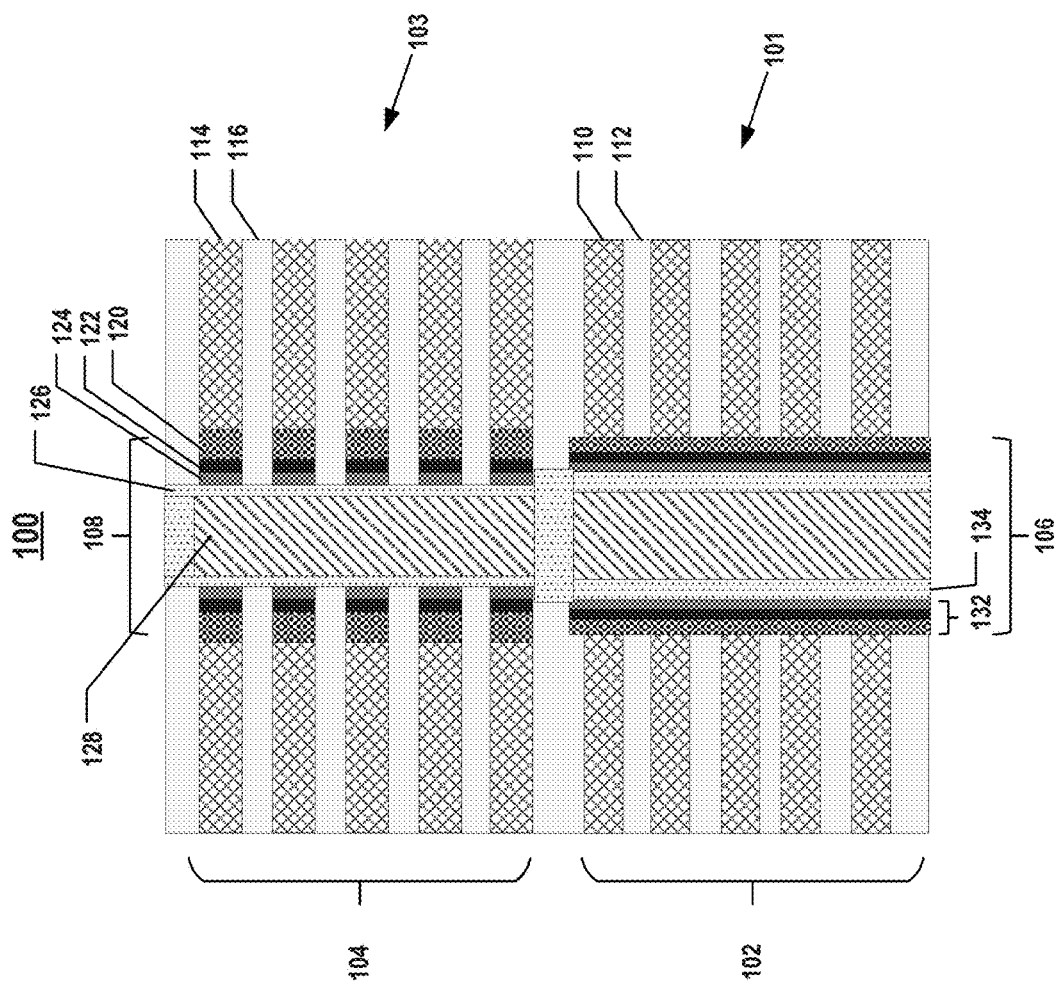
Figure 17:
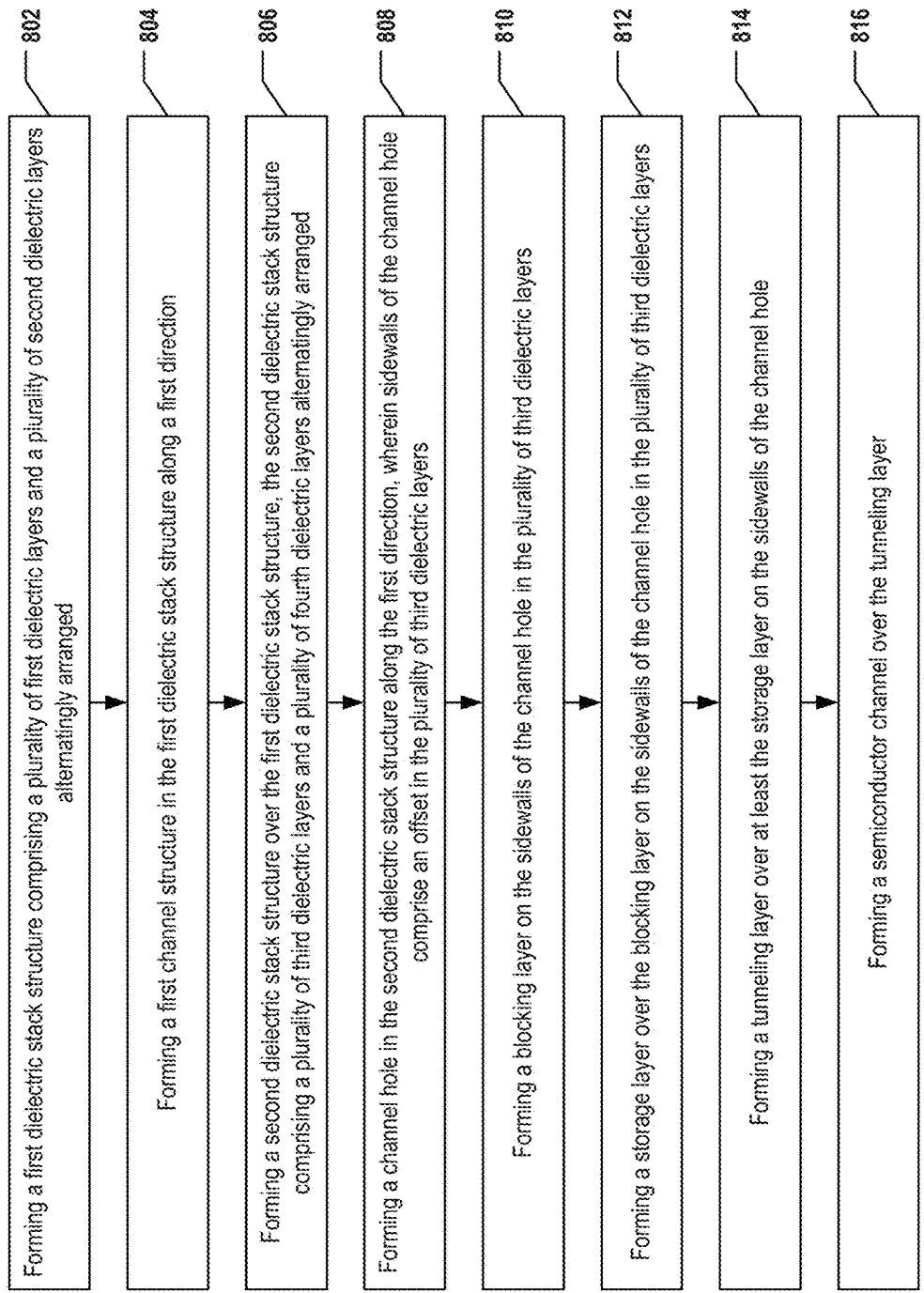
FIG. 17 illustrates a flowchart of an exemplary method for forming a 3D memory device, according to some aspects of the present disclosure.

Then, sacrificial layers 152 and 162 may be removed and replaced by the word lines, as shown in FIG. 16. For example, sacrificial layers 152 and 162 may be removed by dry etch, wet etch, or other suitable processes to form a plurality of cavities. The word lines (conductive layers 110 and 114) may be formed in the cavities by depositing the gate conductor), and the gate conductor made from tungsten. In some implementations, the cavities may be filled with the gate dielectric layer made from high-k dielectric materials, the adhesion layer including titanium/titanium nitride (Ti/TiN) or tantalum/tantalum nitride (Ta/TaN).

By dividing the storage layer into a plurality of isolated sections along the y-direction, partials of the memory film are separated into several inconsecutive sections. The charge stored in the storage layer is isolated from other storage layers corresponding to different word lines. In other words, the charge stored in the storage layers corresponding to different word lines is isolated from each other. Hence, the charge migration may be restrained in the memory structure.

Furthermore, by stacking the memory structures having inconsecutive storage layers and the memory structures having consecutive storage layers together, not only the charge migration may be restrained, the strength of memory structure can also be maintained for multiple-layer memory devices.

Figure 18:
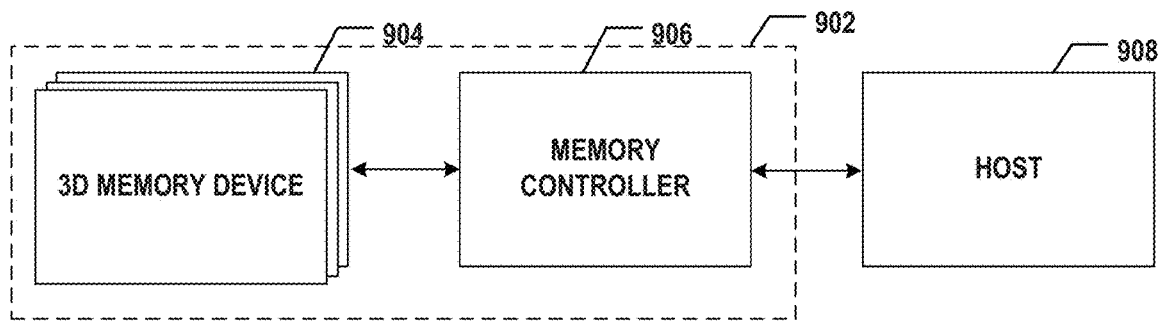
FIG. 18 illustrates a block diagram of an exemplary system having a memory device, according to some aspects of the present disclosure.

FIG. 18 illustrates a block diagram of an exemplary system 900 having a memory device, according to some aspects of the present disclosure. System 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 18, system 900 can include a host 908 and a memory system 902 having one or more memory devices 904 and a memory controller 906. Host 908 can be a processor of an electronic device, such as a central processing unit (CPU), or a system-on-chip (SoC), such as an application processor (AP). Host 908 can be configured to send or receive data to or from memory devices 904.

Memory device 904 can be any memory device disclosed in the present disclosure. As disclosed above in detail, memory device 904, such as a NAND Flash memory device, may have a controlled and predefined discharge current in the discharge operation of discharging the bit lines. Memory controller 906 is coupled to memory device 904 and host 908 and is configured to control memory device 904, according to some implementations. Memory controller 906 can manage the data stored in memory device 904 and communicate with host 908. For example, memory controller 906 may be coupled to memory device 904, such as 3D memory device 100 described above, and memory controller 906 may be configured to control the operations of channel structure 108 through the peripheral device. By forming the structure according to the present disclosure, the charge migration of 3D memory device 100 may be further restrained, and the performance of system 900 may be improved as well.

In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty-cycle environment SSDs or embedded multi-media-cards (eMMCs) used as data storage for mobile devices, such as smartphones, tablets, laptop computers, etc., and enterprise storage arrays. Memory controller 906 can be configured to control operations of memory device 904, such as read, erase, and program operations. Memory controller 906 can also be configured to manage various functions with respect to the data stored or to be stored in memory device 904 including, but not limited to bad-block management, garbage collection, logical-to-physical address conversion, wear leveling, etc. In some implementations, memory controller 906 is further configured to process error correction codes (ECCs) with respect to the data read from or written to memory device 904. Any other suitable functions may be performed by memory controller 906 as well, for example, formatting memory device 904. Memory controller 906 can communicate with an external device (e.g., host 908) according to a particular communication protocol. For example, memory controller 906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 19A:
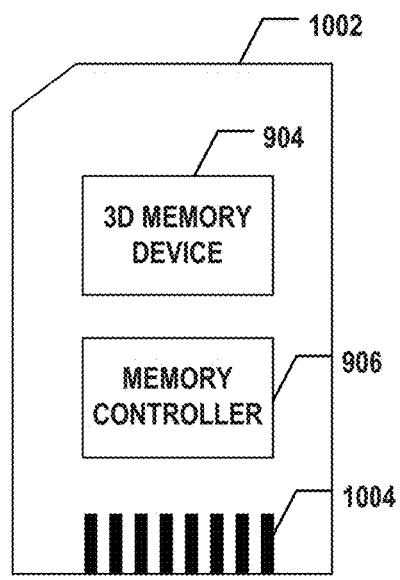
FIG. 19A illustrates a diagram of an exemplary memory card having a memory device, according to some aspects of the present disclosure.
Figure 19B:
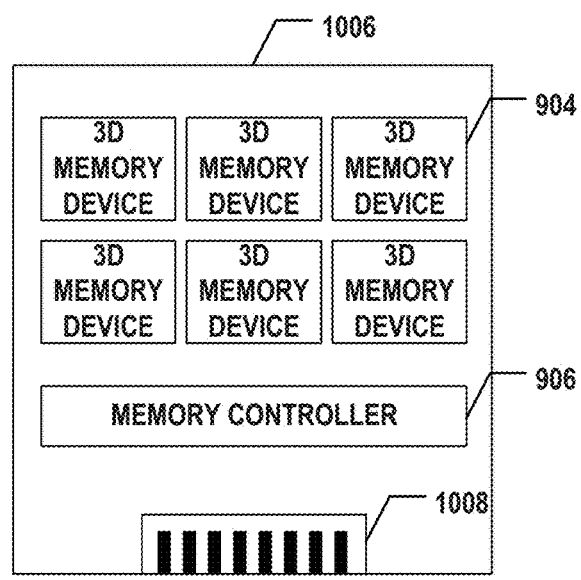
FIG. 19B illustrates a diagram of an exemplary solid-state drive (SSD) having a memory device, according to some aspects of the present disclosure.

Memory controller 906 and one or more memory devices 904 can be integrated into various types of storage devices, for example, be included in the same package, such as a universal Flash storage (UFS) package or an eMMC package. That is, memory system 902 can be implemented and packaged into different types of end electronic products. In one example as shown in FIG. 19A, memory controller 906 and a single memory device 904 may be integrated into a memory card 1002. Memory card 1002 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1002 can further include a memory card connector 1004 coupling memory card 1002 with a host (e.g., host 908 in FIG. 18). In another example as shown in FIG. 19B, memory controller 906 and multiple memory devices 904 may be integrated into an SSD 1006. SSD 1006 can further include an SSD connector 1008 coupling SSD 1006 with a host (e.g., host 908 in FIG. 18). In some implementations, the storage capacity and/or the operation speed of SSD 1006 is greater than those of memory card 1002.

According to one aspect of the present disclosure, a 3D memory device is disclosed. The 3D memory device includes a first stack structure, a first channel structure, a second stack structure, and a second channel structure. The first stack structure includes interleaved first conductive layers and first dielectric layers. The first channel structure extends through the first stack structure along a first direction. The first channel structure includes a first semiconductor channel, and a first memory film over the first semiconductor channel. The first memory film includes a first storage layer. The second stack structure includes interleaved second conductive layers and second dielectric layers formed over the first stack structure. The second channel structure extends through the second stack structure along the first direction. The second channel structure includes a second semiconductor channel, and a second memory film over the second semiconductor channel. The first storage layer is separated by the first dielectric layers into a plurality of sections.

In some implementations, the second memory film includes a second storage layer, and the second storage layer consecutively extends along the first direction. In some implementations, the first memory film further includes a tunneling layer over the first semiconductor channel, and a blocking layer over the first storage layer. In some implementations, the blocking layer is separated by the dielectric layers into the plurality of sections. In some implementations, the tunneling layer is separated by the dielectric layers into the plurality of sections. In some implementations, the tunneling layer is in contact with the first storage layer, the first semiconductor channel, and the first dielectric layers. In some implementations, the tunneling layer extends along the first direction across the first dielectric layers.

In some implementations, the tunneling layer includes a first portion disposed between two adjacent first dielectric layers, and a second portion physically extended along the first direction across the first dielectric layers. In some implementations, the first portion and the second portion of the tunneling layer are in direct contact with each other. In some implementations, the blocking layer, the first storage layer, and the tunneling layer are fully separated by the first dielectric layers into the plurality of sections isolated from each other. In some implementations, top surfaces of the blocking layer, the first storage layer, and the tunneling layer and bottom surfaces of the blocking layer, the first storage layer, and the tunneling layer in each section are in direct contact with the first dielectric layers. In some implementations, the first semiconductor channel is in direct contact with the tunneling layer and the first dielectric layers.

In some implementations, the first storage layer and the first dielectric layers are separated by the tunneling layer. In some implementations, the tunneling layer is in contact with each separated blocking layer of the plurality of sections of the blocking layer. In some implementations, a portion of the tunneling layer and a portion of the first storage layer are overlapped along the first direction. In some implementations, the tunneling layer is in contact with each separated first storage layer of the plurality of sections of the first storage layer on the first direction and a second direction perpendicular to the first direction.

In some implementations, the first storage layer includes a plurality of trap layers. In some implementations, the plurality of sections are stacked along the first direction. In some implementations, the first semiconductor channel is in contact with the second semiconductor channel. In some implementations, the first memory film and the second memory film are electrically isolated. In some implementations, the first stack structure and the second stack structure are stacked along the first direction. In some implementations, the 3D memory device further includes a semiconductor plug disposed at a bottom end of the first channel structure. The semiconductor plug is in contact with the first semiconductor channel.

In some implementations, the 3D memory device further includes a third stack structure including interleaved third conductive layers and third dielectric layers formed over the second stack structure, and a third channel structure extending through the third stack structure along the first direction, the third channel structure comprising a third semiconductor channel, and a third memory film over the third semiconductor channel, and the third memory film comprising a third storage layer. The third storage layer is separated by the third dielectric layers into a plurality of sections.

According to another aspect of the present disclosure, a 3D memory device is disclosed. The 3D memory device includes a plurality of memory structures stacking on each other. Each memory structure includes a stack structure, and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections.

According to still another aspect of the present disclosure, a system is disclosed. The system includes a 3D memory device configured to store data, and a memory controller. The 3D memory device includes a first stack structure, a first channel structure, a second stack structure, and a second channel structure. The first stack structure includes interleaved first conductive layers and first dielectric layers. The first channel structure extends through the first stack structure along a first direction. The first channel structure includes a first semiconductor channel, and a first memory film over the first semiconductor channel. The first memory film includes a storage layer. The second stack structure includes interleaved second conductive layers and second dielectric layers formed over the first stack structure. The second channel structure extends through the second stack structure along the first direction. The second channel structure includes a second semiconductor channel, and a second memory film over the second semiconductor channel. The storage layer is separated by the first dielectric layers into a plurality of sections. The memory controller is coupled to the 3D memory device and is configured to control operations of the 3D memory device.

According to yet another aspect of the present disclosure, a method for forming a 3D memory device is disclosed. A first dielectric stack structure including a plurality of first dielectric layers and a plurality of second dielectric layers alternatingly arranged is formed. A first channel structure is formed in the first dielectric stack structure along a first direction. A channel hole is formed in the first dielectric stack structure along the first direction. The sidewalls of the channel hole include a recess in the plurality of first dielectric layers. A storage layer is formed in the recess of the channel hole in the plurality of first dielectric layers. A semiconductor channel is formed over the storage layer. A dielectric core is formed filling the channel hole. A second dielectric stack structure is formed over the first dielectric stack structure. The second dielectric stack structure includes a plurality of third dielectric layers and a plurality of fourth dielectric layers alternatingly arranged. A second channel structure is formed in the second dielectric stack structure along the first direction.

In some implementations, a blocking layer is formed in the recess of the channel hole in the plurality of first dielectric layers, and a tunneling layer is formed over at least the storage layer in the recess of the channel hole. In some implementations, the second channel structure is above the first channel structure and aligns with the first channel structure. In some implementations, an oxidation operation is performed on the plurality of first dielectric layers to form the blocking layer. In some implementations, the storage layer is formed over the blocking layer in the recess of the channel hole, and a first thinning operation is performed to remove a portion of the storage layer on the plurality of second dielectric layers.

In some implementations, the storage layer includes a plurality of trap layers. In some implementations, the tunneling layer is formed over the recess of the channel hole covering the storage layer and the plurality of second dielectric layers, and a second thinning operation is performed to remove a portion of the tunneling layer on the plurality of second dielectric layers.

In some implementations, the semiconductor channel is formed over the tunneling layer, wherein the semiconductor channel is in contact with the plurality of second dielectric layers. In some implementations, the tunneling layer is formed over the recess of the channel hole covering the storage layer and the plurality of second dielectric layers, and a second thinning operation is performed to thin the tunneling layer. In some implementations, the tunneling layer is in contact with the semiconductor channel, the plurality of second dielectric layers, and the storage layer.

In some implementations, the plurality of first dielectric layers and the plurality of third dielectric layers are removed, and a plurality of word lines are formed between the plurality of second dielectric layers and between the plurality of fourth dielectric layers.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a first stack structure comprising interleaved first conductive layers and first dielectric layers;
   a first channel structure extending through the first stack structure along a first direction, the first channel structure comprising a first semiconductor channel, and a first memory film over the first semiconductor channel, and the first memory film comprising a first storage layer;
   a second stack structure comprising interleaved second conductive layers and second dielectric layers formed over the first stack structure; and
   a second channel structure extending through the second stack structure along the first direction, and the second channel structure comprising a second semiconductor channel, and a second memory film over the second semiconductor channel, and the second memory film comprises a second storage layer,
   wherein the first storage layer and the second storage layer have different continuity in the first direction, the first storage layer is separated by the first dielectric layers into a plurality of storage sections, and the second storage layer consecutively extends along the first direction.

2. The 3D memory device of claim 1, wherein the first memory film further comprises a tunneling layer over the first semiconductor channel, and a blocking layer over the first storage layer.

3. The 3D memory device of claim 2, wherein the tunneling layer is in contact with the first storage layer, the first semiconductor channel, and the first dielectric layers.

4. The 3D memory device of claim 2, wherein the tunneling layer comprises a first portion disposed between two adjacent layers of the first dielectric layers, and a second portion physically extended along the first direction across the first dielectric layers.

5. The 3D memory device of claim 2, wherein the blocking layer, the first storage layer, and the tunneling layer are fully separated by the first dielectric layers into a plurality of sections isolated from each other.

6. The 3D memory device of claim 2, wherein the first storage layer and the first dielectric layers are separated by the tunneling layer.

7. The 3D memory device of claim 6, wherein a portion of the tunneling layer and a portion of the first storage layer are overlapped along the first direction.

8. The 3D memory device of claim 6, wherein the tunneling layer is in contact with each separated first storage section on the first direction.

9. The 3D memory device of claim 2, wherein the tunneling layer and the first storage layer have different continuity in the first direction.

10. The 3D memory device of claim 1, wherein the plurality of storage sections are stacked along the first direction.

11. The 3D memory device of claim 1, further comprising:
    a third stack structure comprising interleaved third conductive layers and third dielectric layers formed over the second stack structure; and
    a third channel structure extending through the third stack structure along the first direction, the third channel structure comprising a third semiconductor channel, and a third memory film over the third semiconductor channel, and the third memory film comprising a third storage layer,
    wherein the third storage layer is separated by the third dielectric layers into a plurality of storage sections.

12. A three-dimensional (3D) memory device, comprising:
    a plurality of memory structures stacking on each other, each memory structure comprising:
    a stack structure comprising interleaved conductive layers and dielectric layers; and
    a channel structure extending through the stack structure along a first direction, the channel structure comprising a semiconductor channel, and a memory film over the semiconductor channel, and the memory film comprising a tunneling layer over the semiconductor channel, a storage layer over the tunneling layer, and a blocking layer over the storage layer,
    wherein the storage layers in two adjacent memory structures have different continuity in the first direction.

13. A method for forming a three-dimensional (3D) memory device, comprising:
    forming a first dielectric stack structure comprising a plurality of first dielectric layers and a plurality of second dielectric layers alternatingly arranged;
    forming a first channel structure in the first dielectric stack structure along a first direction, comprising:
    forming a channel hole in the first dielectric stack structure along the first direction, wherein a sidewall of the channel hole comprises a recess;

forming a first storage layer in the recess of the channel hole in the plurality of first dielectric layers;

forming a semiconductor channel over the first storage layer; and forming a dielectric core filling the channel hole;

forming a second dielectric stack structure over the first dielectric stack structure, the second dielectric stack structure comprising a plurality of third dielectric layers and a plurality of fourth dielectric layers alternatingly arranged; and forming a second channel structure in the second dielectric stack structure along the first direction, comprising forming a second storage layer having second continuity different from first continuity of the first storage layer in the first direction.

14. The method of claim 13, further comprising:
forming a blocking layer in the recess of the channel hole in the plurality of first dielectric layers; and forming a tunneling layer over at least the first storage layer in the recess of the channel hole.

15. The method of claim 14, wherein forming the blocking layer in the recess of the channel hole in the plurality of first dielectric layers, further comprises:
performing an oxidation operation on the plurality of first dielectric layers to form the blocking layer.

16. The method of claim 14, wherein forming the first storage layer in the recess of the channel hole in the plurality of first dielectric layers, further comprises:
forming the first storage layer over the blocking layer in the recess of the channel hole; and performing a first thinning operation to remove a portion of the first storage layer on the plurality of second dielectric layers.

17. The method of claim 14, wherein forming the tunneling layer over at least the first storage layer in the recess of the channel hole, further comprises:
forming the tunneling layer over the recess of the channel hole covering the first storage layer and the plurality of second dielectric layers; and performing a second thinning operation to remove a portion of the tunneling layer on the plurality of second dielectric layers.

18. The method of claim 14, wherein forming the tunneling layer over at least the first storage layer in the recess of the channel hole, further comprises:
forming the tunneling layer over the recess of the channel hole covering the first storage layer and the plurality of second dielectric layers; and performing a second thinning operation to thin the tunneling layer.

19. The method of claim 13, wherein the second channel structure is above the first channel structure and aligns with the first channel structure.

20. The method of claim 13, further comprising:
removing the plurality of first dielectric layers and the plurality of third dielectric layers; and forming a plurality of word lines between the plurality of second dielectric layers and between the plurality of fourth dielectric layers.

* * * * *